United States Patent [19]
Hovekamp

[11] 3,953,225
[45] Apr. 27, 1976

[54] BASIC UNIT PROCESSOR FOR OFFSET PLATES AND METHOD OF PROCESSING THEM

[75] Inventor: John C. Hovekamp, Mansfield, Ohio

[73] Assignee: Buckler Industries, Inc., Mansfield, Ohio

[22] Filed: Aug. 8, 1973

[21] Appl. No.: 386,510

[52] U.S. Cl. .................................... 134/9; 15/100; 14/102; 134/10; 354/319; 354/324
[51] Int. Cl.² ...................... B08B 7/00; G03D 3/08
[58] Field of Search ............. 95/89 R; 354/297, 317, 354/318, 324, 325, 328, 319; 15/100, 102; 134/9, 10

[56] References Cited
UNITED STATES PATENTS

| | | | |
|---|---|---|---|
| 2,555,874 | 6/1951 | Coughlin | 95/89 R |
| 3,059,560 | 10/1962 | Gutzmer | 95/89 R |
| 3,528,358 | 9/1970 | Pickard | 95/89 R |
| 3,593,641 | 7/1971 | Adams et al. | 95/89 R |
| 3,608,464 | 9/1971 | Harrell et al. | 95/89 R |
| 3,625,131 | 12/1971 | Puls | 95/89 R |
| 3,635,144 | 1/1972 | Beck | 354/317 |
| 3,682,079 | 8/1972 | Casson | 95/89 R |

Primary Examiner—Fred L. Braun
Attorney, Agent, or Firm—Cain and Lobo

[57] ABSTRACT

An automatic self-contained basic unit-processor for an offset photolithographic plate which may be used, at different times, for any processing step requiring contacting of the plate by liquid. For example, an exposed plate is developed by contacting the exposed surface of the plate with the conventional developing fluid, and subjecting the surface to a linear, reciprocating rubbing action by a sponge. This rubbing action produces results surprisingly similar to those produced by a manual rotary action. A fully assembled basic-unit processor of this invention requires only that it be connected to a source of power, and to a reservoir for recirculatable processing fluid. A single electric motor is adapted (a) to drive each roll of two pairs of coupled drive rolls, (b) to reciprocate a sponge in frictional contact with a generally horizontal offset plate, and (c) to supply a controllable flow rate of fluid for processing the plate. Rotary movement of the electric motor effects positive rotation of each of a pair of coupled drive rolls, in opposite directions with respect to each other, to negate slipping of a wet plate between them. Translation of rotary movement of the electric motor in a first plane to linear reciprocation in a second plane essentially orthogonal to the first, is effected by a direct rod-actuated drive with swivel rod-ends. The fully assembled basic-unit processor may be used sequentially for various functions, e.g. developing, washing and gumming. It may also be transported through a standard 36-inch wide doorway, eliminating the drawbacks characteristic of machines which are to be assembled at the installation site.

13 Claims, 7 Drawing Figures

BASIC UNIT PROCESSOR FOR OFFSET PLATES AND METHOD OF PROCESSING THEM

BACKGROUND OF THE INVENTION

Though the occasional user of photo-lithographic plates may still process an exposed plate manually, the large-scale commercial utilization of offset plates has made automatic processing of these plates an economic necessity. Moreover, it is well-known that chemicals utilized in the processing of offset plates may be notably injurious to humans and due care must be exercised to prevent harm resulting from exposure to the chemicals.

Manual processing of an exposed offset plate comprises pouring a sufficient quantity of developer on the plate and working the developer over the area of the plate until a dense, even image appears. If the developer expends itself before the plate is fully developed, more developer is added. If the developer becomes tacky, water is added to the sponge to restore a desirable consistency to the developer. After the plate is developed, it is flushed with water and excess water is then removed, as for example, with a squeegee. This method of manual development is essentially the same irrespective as to whether the process is an additive or subtractive process. The developed plate may thereafter be "gummed" if desired, to preserve the plate.

The continuation of manual processing of plates with currently available chemicals is being legislatively discouraged by requirements of government agencies relative to the use of dangerous chemicals, which requirements place severe limitations as to the acceptability of processing plates manually, that is, without breathing some of the vapors or permitting accidental contact of the chemicals.

Again, chemicals used in processing offset plates are notably difficult to dispose of because of their toxic effect on living matter in the environment.

Stricter enforcement of laws with respect to discarding chemicals into conventional sewer systems places a high value on a recirculating and holding tank for chemicals. Thus it is highly desirable to utilize an integrated or self-contained machine in which the chemicals may be recirculated to depletion, prior to being disposed of in a suitable manner.

The foregoing combination of circumstances dictates the use of an automatic self-contained basic-unit processor even for the economically handicapped user of offset plates.

The foregoing remarks are directed equally to additive type and subtractive type developing machines such as are conventionally used at present in the printing industry. They are more particularly directed to subtractive type developing machines. Machines specifically adapted to process exposed-lithographic plates automatically are disclosed in U.S. Pat. Nos. 3,608,464; 3,593,641; 3,589,261; 3,562,834; 3,448,720; and others.

Unlike prior art machines, the basic-unit processor of this invention performs only a single process function at any one time. This apparent limitation affords the unit exceptional versatility as a basic-unit capable of being used as a developer or a coater; as a developer it may be used for subtractive or additive developers; as a coater it may be used for coating a metal plate with a photosensitive material, or for coating a developed offset plate with gum.

The coating of aluminum plates with a wipe-on diazo coating has been a relatively recent development. Initially, and in a few instances where only a very few plates are to be coated, the diazo coating fluid is poured onto a plate and wiped more or less evenly over the surface with a clean, lintless cloth. The plate is thereafter dried. This manual coating of aluminum plates has been superceded by an automatic coater wherein a pair of coupled drive rolls is disposed above the surface of the coating fluid, with the lower roll partially submerged in the coating fluid. A plate to be coated is fed to the rolls, generally face-downwards, and the rotation of the lower roll picks up a pre-determinable quantity of fluid which is deposited on the face of the plate, thus coating it. Often this method of coating a sheet is unsatisfactory, and the sheet is then run a second time, to recoat the sheet. It is believed that rerunning the sheet redissolves part of the coating and negates the effect of entrapped air bubbles and dirt particles which may have been incorporated in the first coating.

Another coating machine which purports to eliminate the problems of air bubble and dirt particle entrapment, includes a brush with a back and forth motion, in combination with the drive rolls of the aforementioned prior art machine. In each of the prior art machines the basic problem of slippage of a wet plate between a pair of coupled drive rolls, remains. In operation, attempts to overcome the slippage problem include increasing the pressure on the drive rolls. Increasing the pressure on the drive rolls is not only detrimental to the surface of the rolls, but also makes it more difficult to provide an even coating. Particularly where a diazo coating fluid is utilized, the chemical action of the fluid tends to harden the rolls and complicates the problem of obtaining a uniform coating on the plate. The results obtained with the basic-unit processor are different from those obtained with prior art machines and this difference in results would not be expected by one skilled in the art.

In addition to being useflul as a coater for sensitizing a plate, the basic-unit processor of this invention may be used with equal facility as a developer of exposed offset plates, whether the plates are to be developed additively or subtractively, and as a washing apparatus for developed offset plates. Finally, the basic-unit processor may again be used as a coater for sealing or gumming the washed plate. Each of the foregoing functions of the basic-unit processor is discharged with only a change of processing fluid and simple changes in operation necessitated by the process fluid used. Moreover, each function is discharged utilizing a rectilinear reciprocating motion of the rubbing means and a positive sychronous drive for drive rolls in each pair of drive rolls through which the plate is transferred. It is well-known that a rubbing action is essential for coating and developing plates, and prior art devices have variously utilized rotary, orbital and rectilinear rubbing motions. Surprisingly, rectilinear reciprocation is found to be the most advantageous rubbing motion which is equally effective for any basic step in the processing of an offset plate.

From a practical point of view, the more successful machines whether for coating or for developing offset plates are relatively large and enormously complicated. Not unexpectedly, these require a capital investment which precludes their acquisition and operation by a small user of plates. With respect to size, it is noted that available machines, for plates from about 25 inches to about 33 inches in width, will not pass, fully assembled, through a standard 36-inch wide doorway and consequently must be assembled at the installation site, preferably by a qualified factory representative. Similarly, a factory-trained maintenance person is generally required to diagnose and rectify malfunctions of prior art machines because the complicated interrelationship of moving parts and a large number of electrical circuits precludes maintenance by persons normally employed in a printing shop. Thus there has been a growing need for a simple, inexpensive, and safe-to-use atuomatic plate processor which will not only be easy to acquire and easy to maintain, but which will not be detrimental to the disposal systems conventionally used for sewage treatment. Above all there is a well-established need for a small basic-unit processor which is versatile, and mechanically as ruggedly reliable as its results are, from a printer's viewpoint, routinely reproducible. This invention is directed to such a need.

SUMMARY OF THE INVENTION

It is therefore a general object of this invention to provide a new and improved apparatus which may be used selectively and at the option of the user, for coating, developing, washing and/or gumming a lithographic plate and the like.

It is another general object of this invention to provide an apparatus for the aforementioned treatment of a plate, which apparatus is self-contained and does not flow used or other processing fluids, water and the like, or other contaminants into a sewer or other disposal system.

It is another general object of this invention to provide a new and improved apparatus for converting rotary motion about a first axis into rotary motion of two pairs of coupled drive rolls, each drive roll of each pair being driven positively in the opposite direction to each other.

It is another general object of the instant invention to provide a machine which emulates the process results of a manual wipe-on motion for spreading a photo-sensitive coating on a metal plate, and a manual rotary movement for aiding the development of an exposed plate, with a surprisingly effective, simple rectilinear reciprocating motion of a rubbing surface such as a sponge which engages the exposed surface of the plate in frictional sliding contact.

It is a more particular object of this invention to provide a processor which may be delivered to a purchaser, ready to use, requiring only that it be connected to a source of power and a reservoir in which chemicals for processing a plate are recirculatably accumulated.

It is a more specific object of this invention to provide an automatic single stage processor for a single processing step on a lithographic plate which processor utilizes simple components co-acting in the framework of a disciplined geometry, wherein a main requirement is that a fully assembled machine be self-contained and promptly utilizable with minor adjustments, for any processing fluid.

It is another specific object of this invention to provide a self-contained integrated basic-unit processor, two or more of which may be used in tandem for sequential processing steps, namely coating a thin metal sheet with a photosensitive coating, developing an exposed plate, washing a developed plate, and gumming a washed plate.

It is still another specific object of this invention to provide a machine in which a single stage for contacting a metal plate with the fluid is compartmentalized by at least two pairs of coupled drive rolls, between which a reciprocating sponge provides the necessary scrubbing motion and simultaneously minimizes the adverse effect of air bubbles and dirt particles which may be entrapped on the surface of the plate.

It is another specific object of this invention to provide a machine in which each drive roll of two pairs of coupled drive rolls is provided with means for being positively driven, the upper drive rolls in one direction, and the lower drive rolls in an opposite direction relative to the direction of the upper drive rolls, so as to provide positive, essentially non-slip transport of a wet offset plate as it is processed.

It is a specific object of this invention to provide a self-contained basic-unit processor wherein drive rolls are driven positively in opposite directions utilizing a dual chain-drive power-transmission mechanism driven by a single drive means.

It is still another object of this invention to provide a basic-unit processor with a predetermined amount of recirculatable processing fluid.

It is still another object of this invention to provide a basic-unit processor in which a single motor means may be used to drive all machine functions.

It is also a specific object of this invention to provide a machine which has built-in safeguards to enable the use of difficultly handled chemicals with safety, to protect the operator of the machine while using them, to enable the full utilization of the chemicals, and to confine the expended chemicals for convenient disposal.

It is another more specific object of this invention to provide a direct, uniquely adapted, rod-actuated drive for oscillating a rocker arm drivingly engaged with a sponge bar to produce the desired linear reciprocating action.

It is another specific object of the instant invention to provide a machine which may be used to feed lithographic plates in either direction through the drive rolls.

A still further object of this invention is to provide a new and improved apparatus for converting rotary motion about a first axis into linear reciprocating motion along a second axis in transversely spaced relationship with said first axis, and simultaneously into rotary motion, of coupled drive rolls each in a direction opposite relative to the other about a third axis in spaced apart parallel relationship with said first axis, a new and improved automatic processor for offset plates utilizable as a basic-unit processor either by itself or in conjunction with a stacker, gumming machine, or other plate processing apparatus, a new and improved chain-drive for utilizing a single rotary means to drive all machine functions, a new and improved variable dispensing pump to provide necessary chemistry, and a new and improved process for either coating an offset plate, or for developing an exposed offset plate, each of which obtains one or more of the objects and advantages set forth hereinabove.

These and other objects, features and advantages of the processor of this invention will become apparent to those skilled in the art from the following description of preferred forms thereof, reference being had to the accompanying drawings.

BRIEF DESCRIPTION OF THE DRAWINGS

In the figures of the drawing, like reference numerals are used to denote like parts. Some of the parts are dimensionally exaggerated for clarity of illustration and to facilitate the description of the drive means and the manner in which it benefits the operation of the automatic processor.

DETAILED DESCRIPTION OF PREFERRED EMBODIMENTS OF THE INVENTION

Figure 1:
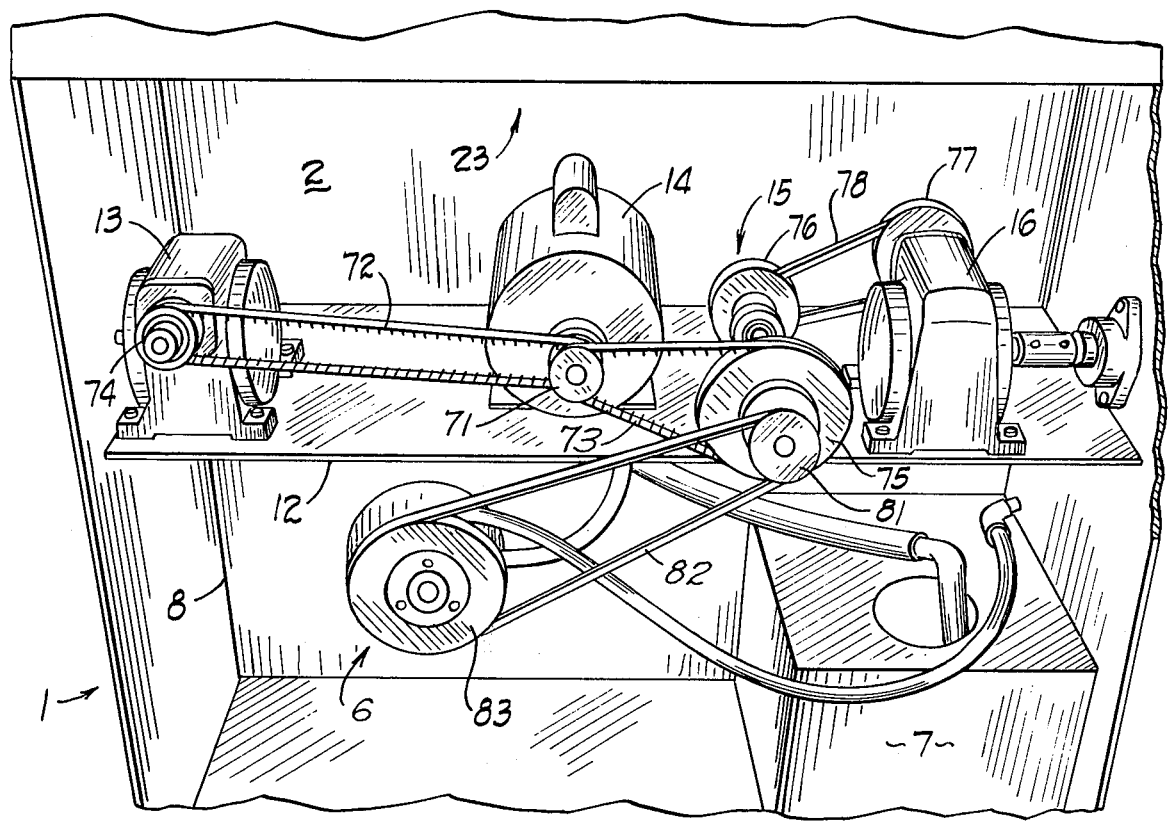
FIG. 1 is a perspective view of the drive mechanism of the basic-unit processor of this invention.
Figure 4:
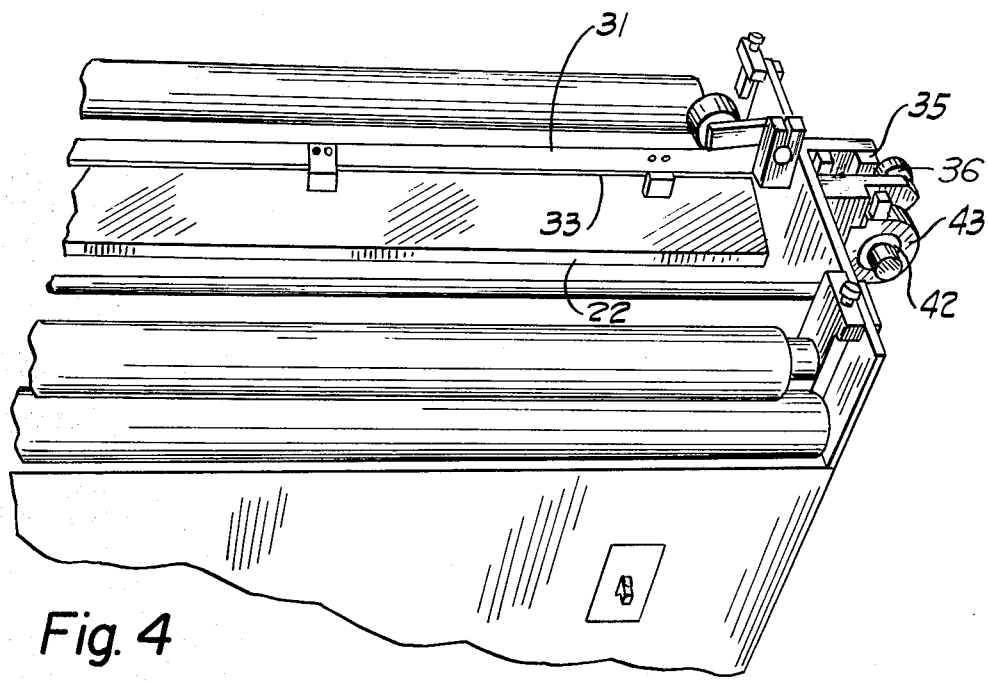
FIG. 4 is a perspective view, partly broken away, of the right side of the processor viewed from one end of the machine, where an offset plate is fed into a first pair of coupled drive rolls.

According to the present invention, the automatic basic-unit processor of this invention may be used either as a 'developer' to develop or as a 'coater' to coat an exposed offset plate. As a developer, it may be used to develop either additive or subtractive photosensitive layers, and as coater it may be used to coat a metal plate with a photosensitive layer, or an exposed and developed offset plate with a protective gum composition. It will be apparent from this description hereinafter that this basic-unit processor may not be used to discharge more than one of the foregoing functions simultaneously; in other words, while it is being used to develop an offset plate it cannot be used to coat the plate, and vice versa. However, this basic-unit processor may be used first to coat a metal plate with a desired photosensitive layer, and, after a suitable change of chemicals, then used to develop an exposed offset plate, and finally, after still another change of chemicals, then used to gum the developed plate. In practice, a multiplicity of plates may be run sequentially and serially for each particular operation of sensitizing, developing and gumming the plates.

It is to be noted that, particularly where chemicals for subtractive developing are used, it is desirable to discharge developed plates into a wash tank or sink in which the plates are washed with water without being manipulated manually. This procedure minimizes the exposure of the operator to the processing chemicals used. For convenience, the basic-unit processor may be mounted on a wheeled carriage or on rollers for ease of movement to and from the sink, as required.

The basic-unit processor of this invention is a self-contained, single-operation processor having a recirculatable process-chemicals supply. Preferably, the process-chemicals for each operation are supplied from a holding tank within the basic-unit processor. However, in those instances where one basic-unit processor is to be used for one or more operations in a more or less fixed location, it may be desirable to provide one or more holding tanks, as necessary, located apart from the processor, but provided with means to connect them for use, recirculatably. Of course, it is not a necessary element of the apparatus of this invention that the chemicals used in each operation be recirculatable, but it will be evident that failure to recirculate costly chemicals is not only economically unjustifiable but ecologically undesirable. In a preferred embodiment, the basic-unit processor and the holding tank are transportable as a unit, the tank being connected for processing a plate and recirculating the process chemicals (sometimes also referred to as the "chemistry"). The basic-unit processor is readied for use simply by connecting it to a suitable source of power.

This basic-unit processor, and details of its construction and operation will hereinafter be described in relation to the subtractive development of an offset plate utilizing chemicals which are generally easier to maintain in homogeneous dispersion than conventional additive developing chemicals. It will be recognized that in an analogous manner, by substituting the appropriate chemistry, the unit may be used as an additive developer, a coater for sensitizing a plate, a gumming apparatus, or simply for washing a plate with water.

Figure 2:
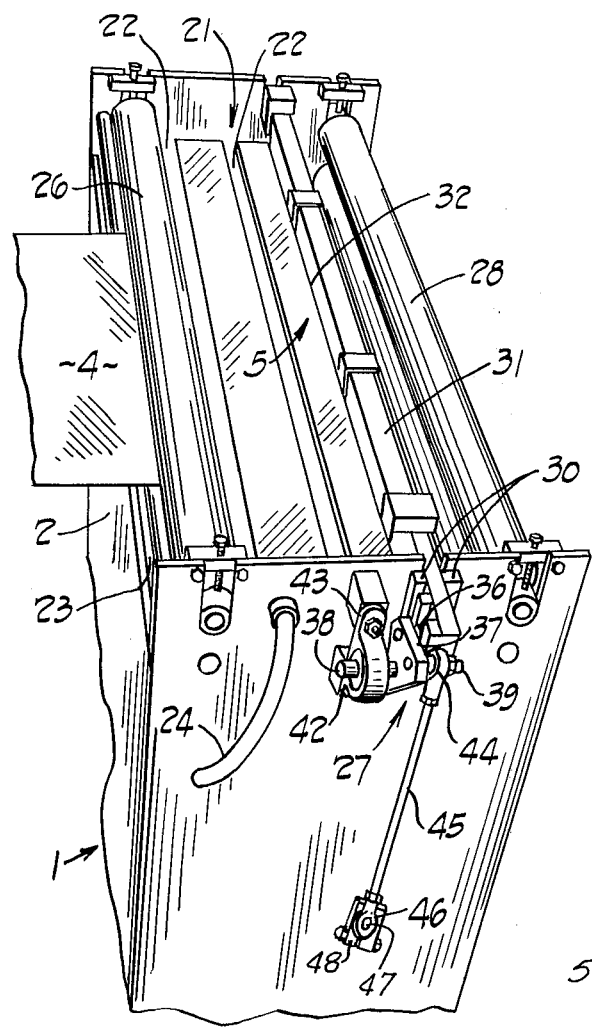
FIG. 2 is a perspective plan view of the processing deck and the direct rod-actuated drive for reciprocating the sponge bar.
Figure 5:
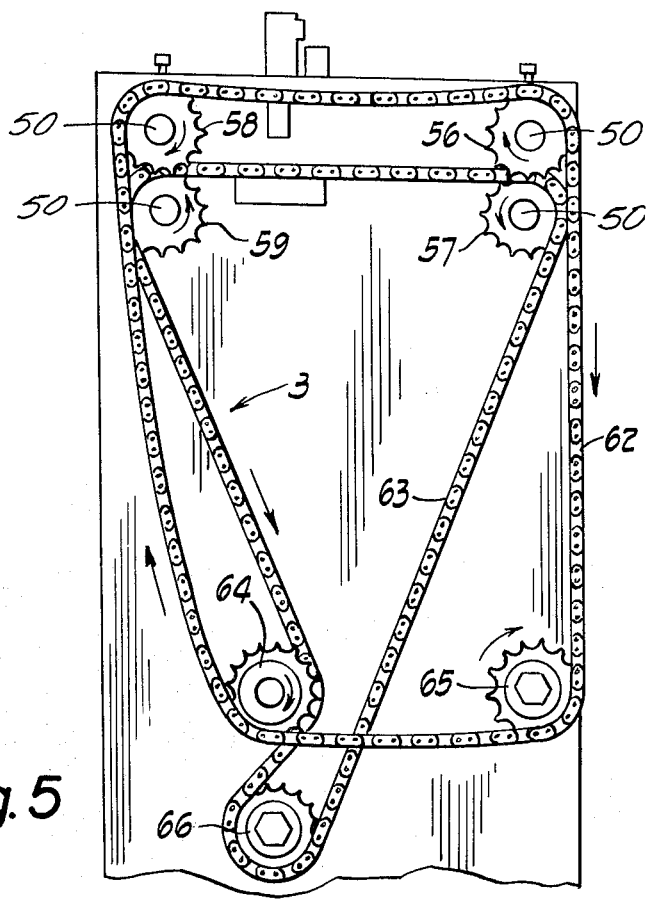
FIG. 5 is an elevation view, partly broken away, of the left side of the processor showing the dual chain-drive mechanism for utilizing the rotary motion of a single motor means to provide the necessary positive drives for each of the drive rolls.

Referring now to FIG. 1, 2 and 5, there is illustrated a self-contained basic-unit processor indicated generally at 1, with covers 2, to protect (a) a chain drive mechanism, indicated generally at 3, for receiving, transporting and discharging an an exposed offset plate 4, (b) a sponge bar assembly or applicator means indicated generally at 5, adapted to reciprocably rub the exposed surface of the plate, (c) pump means, indicated generally at 6, for supplying process-chemicals to be recirculated, (d) a holding tank 7 for the chemicals, and (e) drive means, as will be described hereinafter, for operating (a), (b) and (c). The basic-unit processor is preferably readied for operation by placing it so as to discharge each processed offset plate into a sink, for reasons explained hereinbefore, and connecting a power cable from the processor to a source of electric current (details not shown). The length of the processor in the direction of travel of a plate, is less than 36 inches, with all the covers 2 in position, and the machine fully assembled. This dimension permits the basic-unit processor to be transported through a standard 36-inch doorway.

Figure 6:
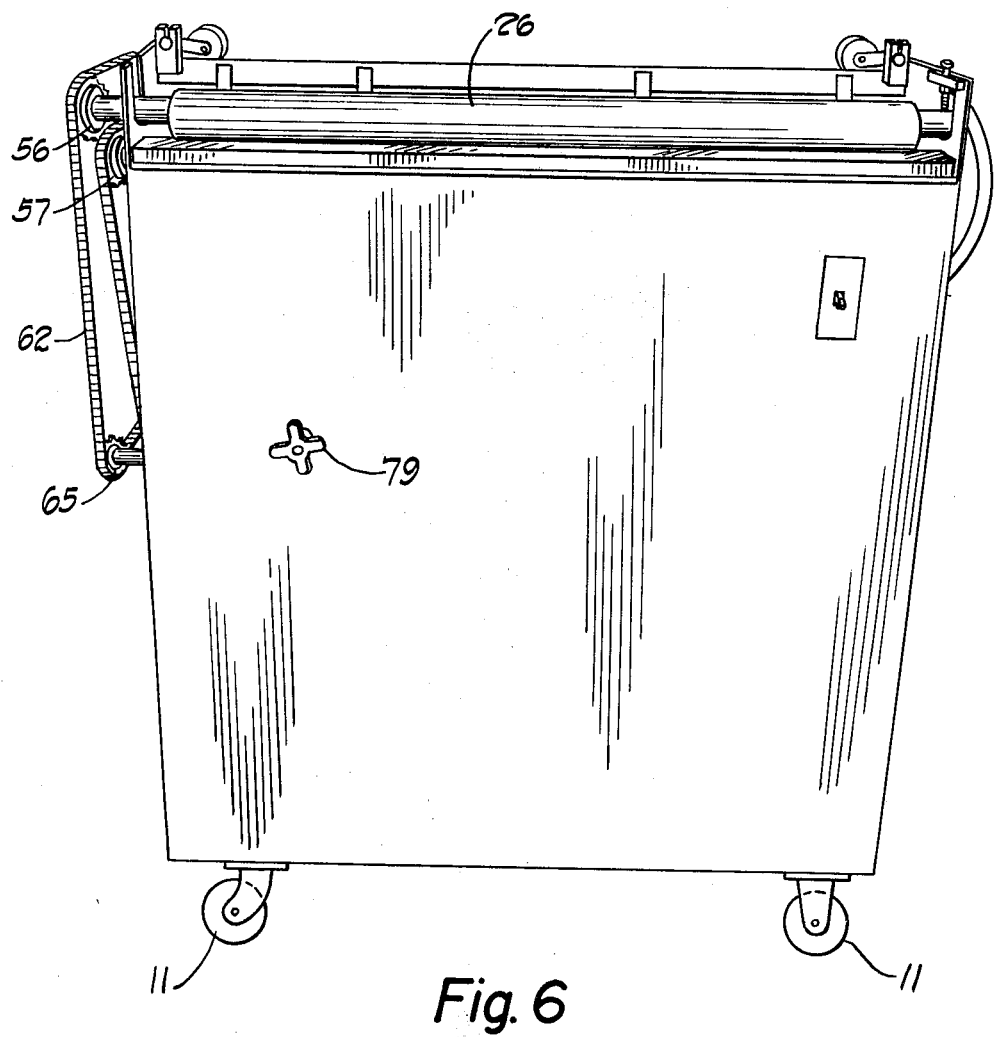
FIG. 6 is an elevation perspective view of the in-feed end of the basic-unit processor.

Processing chemicals, for example Lydel, such as are well-known in the art for subtractively developing an exposed offset plate, are contained in the holding tank 7. The container in which the chemicals are sold serves as a convenient holding tank which may be removably disposed in a structural framework 8. The framework 8 which is disposed on rollers, or other means 11 (FIG. 6) includes a drive deck 12 on which a first reduction gear means 13, an electic motor or other drive means 14, a variable speed drive indicated generally at 15, and a second reduction gear means 16 are operatively disposed. The variable speed drive 15 is drivingly engaged with a pump indicated generally at 6, which is conveniently disposed below the deck 12.

Referring now more particularly to FIG. 2, there is indicated a plate processing deck indicated generally at 21, which is provided with suitable openings 22 through which process chemicals may drain into a drain-pan 23 (See FIG. 1). Process chemicals are conducted to the process deck from the pump 6 by a discharge line 24 and a distribution tub (not shown) through which the chemicals are distributed evenly over the surface of an exposed plate to be developed. The plate 4 enters the process deck 21 through a first pair of coupled in-feed drive rolls 26 at the feed end or in-feed end of the basic-unit processor. The processor is normally operated by a person facing the in-feed end. The chain drive mechanism 3 is disposed on the left hand side or rear of the machine, and the sponge bar assembly 5 is drivingly engaged with a direct rod-activated drive, indicated generally at 27, disposed on the right hand side or front of the machine.

A second pair of coupled out-feed drive rolls 28 are disposed at the out-feed or discharge end of the processor. Each pair of coupled drive rolls is adapted to receive a plate therebetween, and to urge the plate therethrough. Moreover, as will be explained hereinafter, each drive roll of each pair of drive rolls is positively rotated, preferably synchronously, that is at essentially the same speed, so as to permit an essentially non-slip transfer of a wet plate which is pressingly engage between each pair of drive rolls.

The sponge bar assembly 5 is disposed intermediate the in-feed and out-feed drive rolls and essentially coplanarly therewith. The sponge bar assembly comprises a bar 31 which extends across the process deck 21. The bar 31 supports a channel 32 in which an elongated sponge is removably disposed by any suitable means such as prongs (not shown). Any resilient rubbing means may be used, but a sponge, whether natural or synthetic, is preferred. The sponge is so disposed as to be in frictional sliding contact with the plate to be processed.

Figure 7:
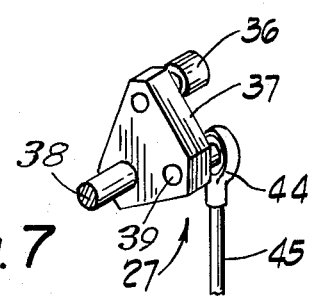
FIG. 7 is a perspective view, partly broken away, of a rocker plate in the direct rod-actuated drive.

One end of the bar 31, on the right hand side of the processor, is disposed between a pair of guides 30, and the other end of the bar 31 is similarly disposed between another pair of guides (not shown) to facilitate rectilinear reciprocation of the bar. The right hand end of the bar 31 is provided with a cam follower block 35 adapted to engage a cam 36. It has been found that this particular relationship of cam and cam follower, rather than vice versa, provides a rectilinear movement of the sponge coplanarly with the surface of the plate 4 to be processed thus permitting even, frictional sliding contact of the sponge across the plate. The cam 36 is fixedly disposed in a rocker plate 37 (See FIG. 7) fixedly disposed on one end of a shaft 38. a pin 39 is also fixeldy disposed on the rocker plate 37 and located so that the cam 36 and the pin 39 are equidistant from the end of the shaft on which the rocker plate 37 is mounted. The shaft 38 is rotatably disposed in a roller bearing 42 mounted in a pillow block 43 against the right side of the structrual framework of the processor. In the embodiment illustrated herein, a single sponge bar assembly 5 is used; however this is not meant to limit the invention in that manner.

The pin 39 has journalled thereupon a swivel rod-end 44 adjustably disposed at one end of a rod means 45. Another swivel rod-end 46 is adjustably disposed at the other end of the rod 45 and journalled upon a stub shaft 47 which projects from a crankarm 48 rotatable about a horizontal axis. Rotation of the crankarm 48 produces a back and forth rocking or oscillating motion of the rocker plate 37 about an axis transversely spaced from, but not parallel with, the axis of rotation of the crankarm. It will be evident, that to obtain the rectilinear reciprocation of the sponge bar assembly in the plane desired, with simplicity, the axes referred to are preferably perpendicular to one another.

It will be recognized that swivel rod-ends are desirable to accomodate angulation of the rod 45 which otherwise would 'bind' thus permitting non-parallelogramatic motion to be imparted, utilizing direct rod means. Other means may be used for this purpose, such as, for example, a flexible rod with predetermined rigidity, so chosen as to flex to the extent necessary to permit angulated motion of the flexible rod which may utilize conventional, fixed or non-swivelling rod-ends. Alternatively, a conventional rod with fixed rod-ends may be modified by sectioning the rod to provide at least two spring-connected sections. A fixed rod end on one section may be pivotally disposed on the pin 39 and a fixed rod end may be pivotally disposed on the stubshaft 47, so that the spring between the sections accomodates angulation of the rod sections and transmits a copressive, pushing force.

Figure 3:
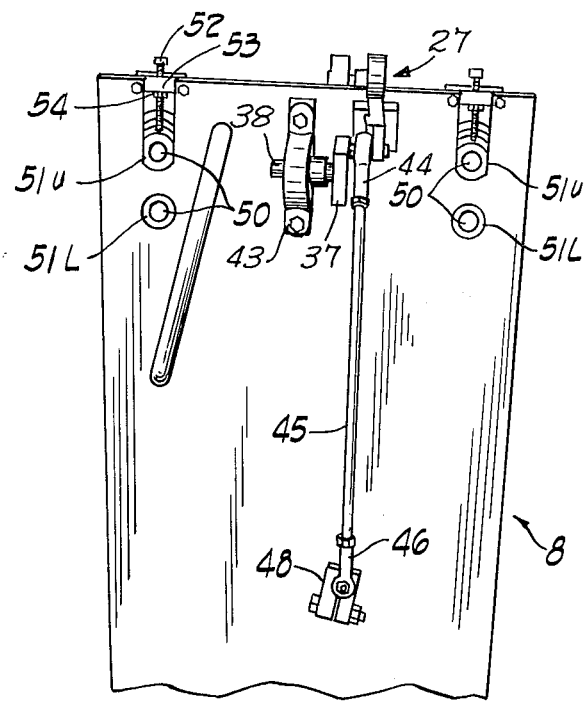
FIG. 3 is an elevation view, partly broken away, of the right side of the processor showing the direct rod-actuated drive for reciprocating the sponge bar.

Referring now to FIG. 3, each drive roll of the in-feed and out-feed drive roll pairs is fixedly disposed on a shaft 50, each end of which is journalled in upper bearing blocks 51-U and lower blocks 51-L mounted in the right and left sides of the structural framework 8. The upper bearing blocks 51-U have an oval shaped surface with the opposite surfaces being so adapted as to permit adjustment of the relative pressure exerted between each pair of drive rolls. This is conveniently effected by a pressure adjusting means such as a bolt 52 threadedly disposed in a support bar 53. A lock-nut 54 is provided to lock the bolt 52 at any desired roller pressure. Similar pressure adjusting means are provided for each upper roll and the drive rolls are readied for operation by setting the rolls to exert an even pressure therebetween. Other pressure adjusting means such as a wedge or cam may be used also.

Referring now to FIG. 5, it is seen that the left hand side ends of the drive roll shafts 50 protrude through upper and lower bearing blocks 51-U and 51-L respectively in a manner analogous to the right-hand side bearing blocks described hereinbefore in FIG. 3. Each shaft end protrudes sufficiently to permit sprocket means to be fixedly disposed thereupon. The upper in-feed drive roll has a sprocket 56 keyed thereto; the lower in-feed drive roll has a sprocket 57 keyed thereto; the upper out-feed drive roll has a sprocket 58 keyed thereto; the lower out-feed drive roll has a sprocket 59 keyed thereto. Instead of sprockets, pulleys may be used, or any other means which may be adapted for positive rotation. Sprockets are preferred for ruggedness, precision and reliability. It will be noted that each sprocket is rotatable in a plane parallel to and spaced apart from the other sprocket in each pair. This spacing results from the fact that the diameter of each drive roll is relatively smaller than the diameter of the sprockets, and permits the upper drive rolls to be driven in a forward plane and the lower rolls to be driven in a rear plane.

The upper drive roll sprockets 56 and 58 are driven by a forward drive chain 62 drivingly trained thereupon and the lower drive roll sprockets 57 and 59 are driven by a rear drive chain 63 drivingly trained thereupon. Both chains 62 and 63 are drivingly trained upon a dual drive sprocket 64 keyed to the shaft of the reduction gear drive means 16 (See FIG. 1). Additionally, a front idler sprocket 65 and a rear idler sprocket 66 are rotatably disposed for rotation in the front and rear planes respectively. The front chain 62 is drivingly trained on the front row of teeth of a dual sprocket 64, and sprockets 65, 56 and 58 so as to produce a clockwise rotation of all sprockets when the dual sprocket 64 is rotated in a clock-wise direction. The rear chain 63 is drivingly trained on the rear row of teeth of the dual sprocket 64 so that, with the same clock-wise rotation, sprockets 66, 57 and 59 are driven in a counter-clockwise direction. In the particular embodiment described herein, all sprockets are 17-pitch sprockets so as to drive both upper and lower drive rolls at the same speed. This configuration of sprockets may be used to drive any driven elements where opposite rotation of positively driven elements is desired. In the instant basic-unit processor this dual chain-drive mechanism permits a wet offset plate to be received by and urged through coupled drive rolls with essentially no slip between the plate and the drive rolls.

Referring again to FIG. 1, it will be seen that the electric motor 14, by itself, provides the drive means for all drive functions of the basic-unit processor. The shaft of the motor 14 is provided with a sheave 71 which is wide enough to accomodate two timing belts 72 and 73 in side-by-side relationship thereupon. The belt 72 drivingly engages a sheave 74 of the reduction gear means 13 and effects rotation of the crankarm 48. The timing belt 73 drivingly engages a sheave 75 of the variable speed drive means 15, such as is commercially available from Browning, which includes a spring-loaded sheave 76 and a manually controlled sheave 77 drivingly engaged with a V-belt 78. The manual sheave 77 is adjusted for a desired speed by means of a control knob 79 (See FIG. 6) at the in-feed end of the processor.

The variable drive means 15 is also provided with a sheave 81 which is drivingly engaged, by means of a V-belt 82, with a sheave 83. The sheave 83 operates the pump means 6 and supplies process chemicals for processing a plate on the process deck. When a basic-unit processor is used for a single specific operation, say developing with a particular subtractive developer, the ratio of the diameters of sheaves 81 and 83 is chosen to provide the optimum flow rate of developer. Where, on the other hand, the basic-unit processor is used for several functions, or with developers which require different flow rates, the sheave 81 is replaced with a spring-loaded sheave similar to the sheave 76 and the sheave 83 is replaced with a manually controlled sheave similar to sheave 77. It will be understood that the ratio of pulleys for such a substitution will be such as to permit the desired range of pumping rates by a control knob in an analogous manner as with control knob 79.

The foregoing description refers to a single basic-unit processor which may be used selectively, at the option of the user, for any one of several processing steps to which a lithographic plate is subjected. The rate at which the plate is fed through a basic-unit processor and the rate of flow of processing fluids depends on the particular processing step for which the basic-unit is used, the choice of processing fluid and the particular characteristics of the plate being processed. If desired a basic-unit processor may be used in combination with a dryer if drying is necessary.

Where two or more processing steps are to be carried out sequentially two or more basic-unit processors may be used in tandem. For example a first basic-unit may be used to coat a metal plate with a photosensitive layer, a second basic-unit may be used to develop an exposed lithographic plate, a third basic-unit may be used to wash the plate and a fourth unit may be used to gum the washed plate. It will be apparent that any combination of processing steps may be practiced using plural basic-unit processors in tandem.

Modifications, changes and improvements to the preferred forms of the invention herein disclosed, described and illustrated may occur to those skilled in the art who come to understand the principles and precepts thereof. Accordingly, the scope of the patent to be issued hereon should not be limited to the particular embodiments of the invention set forth herein, but rather should be limited by the advance by which the invention has promoted the art.

What is claimed is:

1. A process for contacting a plate or sheet with a process liquid comprising feeding said plate into a first pair of coupled drive rolls adapted to receive said plate therebetween and to urge said plate therethrough, rectilinearly, reciprocatingly, rubbing a surface of said plate with a resilient rubbing means, feeding said plate into a second pair of coupled drive rolls adapted to receive said plate therebetween and to urge said plate therethrough, operating said first and second pair of coupled drive rolls and said rubbing means with a singular drive means, and recirculatably supplying said process liquid to said surface of said plate.

2. A basic-unit processor, for contacting a plate or sheet with a process liquid, comprising a first pair of coupled drive rolls adapted to receive said plate therebetween and to urge said plate therethrough, a second pair of coupled drive rolls adapted to receive said plate therebetween and to urge said plate therethrough, a rectilinearly reciprocable rubbing means, for rubbing said plate, disposed intermediate said first pair and said second pair of coupled drive rolls, means for supplying said process liquid to the surface of said plate, direct rod-actuated means for rectilinearly reciprocating said rubbing means, and drive means operatively engaging one drive roll of each said pair, for positively rotating said one drive roll of each said pair in an opposite direction with respect to the other.

3. The basic-unit processor of claim 2 wherein said drive means comprises a drive-sprocket means fixedly disposed upon a drive shaft rotatable about a first axis, a first continuous flexible drive mean, and a second continuous flexible drive means, simultaneously drivingly engaged with said drive-sprocket means, each said flexible drive means drivingly engaging one drive roll of each said pair, for positively rotating said one drive roll of each said pair in an opposite direction with respect to the other; and, means to rotate said drive shaft.

4. The basic-unit processor of claim 2 wherein said rubbing means has a resilient rubbing surface adapted to be disposed in frictional sliding contact with a surface of said plate.

5. The basic-unit processor of claim 2 wherein said direct rod-actuated means to effect rectilinear reciprocation of said rubbing means includes a rotatable crank arm and stub-shaft therewith, and rod means having one end journalled on said stub-shaft and the other end adapted for oscillating a rocker arm operatively engaged with said rubbing means.

6. The basic-unit processor of claim 2 wherein said direct rod-actuated means for rectilinearly reciprocating said rubbing means, and, said drive means, are driven by a single motor means.

7. The basic-unit processor of claim 2 wherein said drive means includes means to set a preselected speed of rotation of said drive rolls.

8. The basic-unit processor of claim 2 wherein said means for supplying said process liquid to the surface of said plate includes a reservoir for said process liquid, and, pump means for recirculatably supplying said liquid.

9. The basic-unit processor of claim 8 wherein said direct rod-actuated means to effect rectilinear reciprocation of said rubbing means, said drive means, and, said pump means, are driven by a single motor means.

10. The basic-unit processor of claim 8 including means for obtaining a preselected rate of flow of said liquid.

11. A basic-unit processor, for contacting a plate or sheet with a process liquid, comprising a first pair of coupled drive rolls adapted to receive said plate therebetween and to urge said plate therethrough, a second pair of coupled drive rolls adapted to receive said plate therebetween and to urge said plate therethrough, a rectilinearly reciprocable rubbing means, for rubbing said plate, disposed intermediate said first pair and said second pair of coupled drive rolls, means for supplying said process liquid to the surface of said plate, direct rod-actuated means for rectilinearly reciprocating said rubbing means, said direct rod-actuated means including a rotatable crank arm and stub-shaft therewith, and rod means having one end journalled on said stub-shaft and the other end adapted for oscillating a rocker arm operatively engaged with said rubbing means.

12. A basic-unit processor, for contacting a plate or sheet with a process liquid, comprising a first pair of coupled drive rolls adapted to receive said plate therebetween and to urge said plate therethrough, a second pair of coupled drive rolls adapted to receive said plate therebetween and to urge said plate therethrough, a rectilinearly reciprocable rubbing means, for rubbing said plate, disposed intermediate said first pair and said second pair of coupled drive rolls, a singular drive means operating the first and second pair of coupled drive rolls and said rubbing means, means for supplying said process liquid to the surface of said plate, and a reservoir for liquid which has contacted said plate.

13. The combination of more than one basic unit processor for operation in tandem to sequentially contact a metal plate with more than one processing fluid wherein each basic-unit processor comprises a first pair of coupled drive rolls adapted to receive said plate therebetween and to urge said plate therethrough, a second pair of coupled drive rolls adapted to receive said plate therebetween and to urge said plate therethrough, a rectilinearly reciprocable rubbing means, for rubbing said plate, disposed intermediate said first pair and said second pair of coupled drive rolls, means for supplying said process liquid to the surface of said plate, direct rod-actuated means for rectilinearly reciprocating said rubbing means, and drive means operatively engaging one drive roll of each said pair, for positively rotating said one drive roll of each said pair in an opposite direction with respect to the other.

* * * * *